United States Patent
Beschnitt et al.

(10) Patent No.: US 9,979,391 B2
(45) Date of Patent: May 22, 2018

(54) OPERATING UNIT FOR AN ELECTRICAL APPARATUS, IN PARTICULAR FOR A VEHICLE COMPONENT

(71) Applicant: Behr-Hella Thermocontrol GmbH, Stuttgart (DE)

(72) Inventors: Alexander Beschnitt, Herford (DE); Winfried Fust, Lippstadt (DE); Michael Steinkamp, Lippstadt (DE); Frank Vogt, Husen (DE)

(73) Assignee: Behr-Hella Thermocontrol GmbH, Stuttgart (DE)

( * ) Notice: Subject to any disclaimer, the term of this patent is extended or adjusted under 35 U.S.C. 154(b) by 0 days. days.

(21) Appl. No.: 15/327,469

(22) PCT Filed: Jul. 8, 2015

(86) PCT No.: PCT/EP2015/065587
§ 371 (c)(1),
(2) Date: Jan. 19, 2017

(87) PCT Pub. No.: WO2016/012243
PCT Pub. Date: Jan. 28, 2016

(65) Prior Publication Data
US 2017/0155387 A1 Jun. 1, 2017

(30) Foreign Application Priority Data

Jul. 22, 2014 (DE) .................. 10 2014 214 218

(51) Int. Cl.
*B60L 1/00* (2006.01)
*H03K 17/96* (2006.01)
(Continued)

(52) U.S. Cl.
CPC ....... *H03K 17/9625* (2013.01); *B60H 1/0065* (2013.01); *B60K 37/06* (2013.01);
(Continued)

(58) Field of Classification Search
CPC ............ H03K 17/9625; H03K 17/962; H03K 17/9627; H03K 17/9645; B60H 1/0065;
(Continued)

(56) References Cited

U.S. PATENT DOCUMENTS

2008/0018611 A1  1/2008  Serban et al.
2014/0055397 A1  2/2014  Becker et al.

FOREIGN PATENT DOCUMENTS

DE   10 2011 010229 A1   8/2012
DE   10 2012 221107 B3   5/2014
(Continued)

OTHER PUBLICATIONS

International Search Report and Written Opinion for corresponding Patent Application No. PCT/EP2015/065587 dated Oct. 26, 2015.

*Primary Examiner* — Daniel Cavallari
(74) *Attorney, Agent, or Firm* — Renner, Otto, Boisselle & Sklar, LLP

(57) ABSTRACT

The invention relates to an operating unit (10) for an electrical apparatus, in particular a vehicle component such as, for example, a heating, ventilation and/or air conditioning installation, which is provided with a housing (12) having a front wall (14), with an operating strip (18) that projects beyond the front wall (14), which has an elongated operating surface (20) with a plurality of adjacently arranged operating fields (22, 24, 26, 28, 30), and with a support element (32) for the operating strip (18), which is arranged in the housing (12). The operating strip (18) is connected to the support element (32) by means of connecting webs (48) which protrude in the respective areas between the operating panels (22, 24, 26, 28, 30) of the operating strip (18). Flexible webs (50), which protrude from the operating strip (18) for each operating field and are connected to the support element (32), are arranged between the connecting webs (48), namely in an elastic manner and more flexible than the (Continued)

Figure 1:
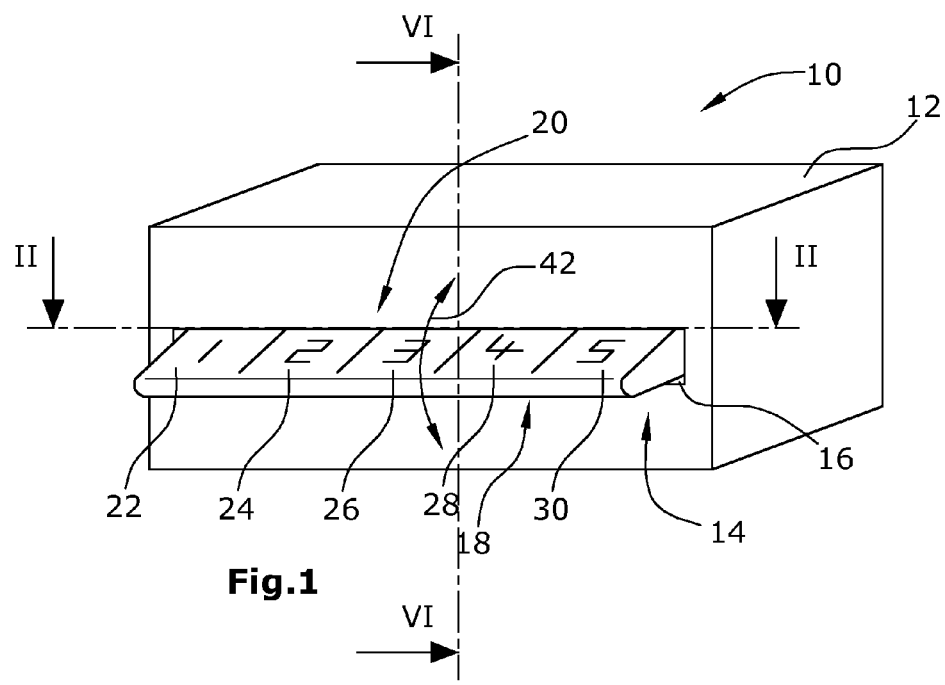

connections of the operating strip (18) to the support element (32) via the connecting webs (48). At least one operating field actuation sensor (70, 72) for detecting a local bending of the operating strip (18), when a manual actuating force is exerted on a operating field (22, 24, 26, 28, 30) of the operating strip (18), is arranged on the support element (32) for each flexible web (50). In addition, the operating unit (10) comprises an evaluation and operating unit (78) for receiving the signals of the operating panel actuating sensors (70, 72) and for determining, on the basis of said signals, the operating field (22, 24, 26, 28, 30) on which, upon manual actuation of the operating strip (18), the finger of one hand is applied, and for triggering an apparatus function that is associated with the respective operating field (22, 24, 26, 28, 30) corresponding to the determined operating field (22, 24, 26, 28, 30).

14 Claims, 4 Drawing Sheets

(51) Int. Cl.
*H01H 15/14* (2006.01)
*B60K 37/06* (2006.01)
*B60H 1/00* (2006.01)

(52) U.S. Cl.
CPC .......... *H01H 15/14* (2013.01); *H03K 17/962* (2013.01); *H03K 17/9627* (2013.01); *H03K 17/9645* (2013.01); *B60K 2350/1036* (2013.01)

(58) Field of Classification Search
CPC . B60K 37/06; B60K 2350/1036; H01H 15/14
See application file for complete search history.

(56) References Cited

FOREIGN PATENT DOCUMENTS

| | | |
|---|---|---|
| DE | 10 2014 214 218 A1 | 1/2016 |
| EP | 1 988 441 A1 | 11/2008 |
| WO | 00/34068 A1 | 6/2000 |
| WO | 2013/153048 A1 | 10/2013 |
| WO | WO 2013153048 A1 * 10/2013 | ......... H03K 17/9625 |

* cited by examiner

OPERATING UNIT FOR AN ELECTRICAL APPARATUS, IN PARTICULAR FOR A VEHICLE COMPONENT

The present patent application claims the priority of German Patent Application 10 2014 214 218.0 of Jul. 22, 2014 the disclosure of which is incorporated herein by reference.

The invention relates to an operating unit for an electrical apparatus which may in particular be a vehicle component e.g. a heating, ventilation or air conditioning system.

Operating units for electrical apparatuses are known in a wide variety of forms. In particular in the field of motor vehicles operating concepts have been established recently in which a strip-shaped operating element is movably supported, the element having a plurality of operating fields for triggering different functions of an apparatus when actuated manually, wherein a corresponding sensor system detects the contact position of a finger of a hand on the operating strip and it can thereby be determined which apparatus function has been selected. The sensor system may e.g. be formed by proximity or contact sensors which mostly operate capacitively. If e.g. for design reasons the entire operating strip comprises a metal operating surface or an operation is possible while wearing gloves, a capacitive sensor system cannot be implemented in the operating strip. Other concepts exist in which, by means of differential signals, bending force sensor systems or distance sensor systems at different positions of the support of the operating strip make it possible to determine the position of a finger of a hand when the operating strip is actuated (see e.g. WO-A-2013/153048).

From DE-B-10 2012 221 107 an operating unit for a vehicle component is known, which has a housing with a front wall and an operating strip protruding beyond the front wall and having a plurality of operating fields, as well as with a support element arranged in the housing and an evaluation and control unit.

From US-A-2008/0018611 an operating unit for an electrical apparatus is known, which has a front wall and an operating strip with a plurality of operating fields, a support element and an evaluation and control unit, wherein the operating strip is connected to the support element via connecting webs between the operating fields, and the operating fields of the operating strip are arranged elastically, as well as flexibly between the connecting webs, and at least one operating field actuation sensor is arranged at the support element to detect a local bending of the operating strip upon manual actuation.

It is an object of the invention to provide an operating unit for an electrical apparatus in which it is possible to detect the position of the finger in a highly reliable and safe manner when an operating strip of the operating unit is actuated.

To achieve this object the invention provides an operating unit for an electrical apparatus, in particular for a vehicle component such as, for example, a heating, ventilation and/or air conditioning installation, the operating unit being provided with a housing having a front wall, an operating strip projecting beyond the front wall, the operating strip having an elongated operating surface with a plurality of operating fields arranged side by side, a support element for the operating strip, which is arranged in the housing, wherein the operating strip is connected to the support element by means of connecting webs which protrude in the respective areas between the operating fields of the operating strip, wherein flexible webs, which protrude from the operating strip for each operating field and are connected to the support element, are arranged between the connecting webs, namely in an elastic manner and more flexible than the connections of the operating strip to the support element via the connecting webs, wherein at least one operating field actuation sensor is arranged on the support element for each flexible web for the detection of a local bending of the operating strip, when a manual actuating force is exerted on an operating field of the operating strip, and an evaluation and operating unit for receiving the signals of the operating field actuation sensors and for determining, on the basis of said signals, the operating field on which, upon manual actuation of the operating strip, a finger of one hand is applied, and for triggering an apparatus function that is associated with the respective operating field corresponding to the determined operating field.

The operating unit of the present invention has a housing with a front wall beyond which an operating strip protrudes, the operating strip having an elongated operating surface extending along the front wall and being provided with a plurality of operating fields arranged side by side. A support element is arranged in the housing, with which the operating strip is connected in a comparatively rigid manner in its areas between the operating fields and in a comparatively flexible manner in the area of its operating fields. For this purpose connecting webs and flexible webs alternately protrude from the support element. The connecting rods are comparatively rigid and are connected with the operating strip in their respective areas between the operating fields. The flexible webs are respectively situated between two adjacent connecting webs and serve for a flexible, elastic connection of the operating strip with the support element in the area of the operating fields of the operating strip.

The operating strip may be made from such a material (generally a plastic material) that it is slightly elastically deformed locally when actuated manually, i.e. when pressed by a finger of a hand, which, however, is not optically discernible. If a finger of a hand contacts an operating field of the operating strip and then presses the operating strip, the operating strip bends slightly and imperceptibly for the operator in this operating field, wherein, due to the comparatively rigid connection of the operating strip between the adjacent operating fields, this effect is substantially restricted to the respective operating field, i.e. the operating fields are mechanically decoupled from each other in this respect. According to the invention each operating field of the operating strip is associated with an operating field actuation sensor positioned at the support element. Each operating field actuation sensor detects the local bending of the operating strip when an actuating force is exerted manually on an operating field of the operating strip, by the bending of the flexible web connected with the corresponding operating field of the operating strip. Via an evaluation and control unit connected with the operating field actuation sensors, the operating field on which a finger of a hand rests when the operating strip is actuated manually, can then be determined on the basis of the signals of these operating field actuation sensors. Accordingly, the apparatus function assigned to the respective operating field may then be triggered. Thus, due to the mechanical decoupling of the bending of the operating strip, the operating field actuation sensor assigned to the respective operating field, on which a finger of a hand rests upon actuation, outputs the largest signal when compared to the operating field actuation sensors arranged adjacent the respective operating field.

By means of this kind of signal pattern recognition a very reliable conclusion can then be drawn on the operating field on which a finger of a hand rests when the operating strip is actuated. If, for example, the operating field actuation sensors of two adjacent operating fields should output signals of substantially the same amplitude, this is indicative of the fact that a finger of a hand rests on the border between two operating fields when the operating strip is actuated; in this case no apparatus function should be triggered.

When an elongated operating strip is actuated, the concept according to the present invention allows for a very precise determination of the position of a finger of a hand on the operating strip upon the actuation thereof.

The alternating differently flexible connection of the operating strip with the support element may be realized in a variety of different forms. For example, it is conceivable that, for reasons of their geometry, their material and/or the position of their connection with the support element and/or the operating strip, the connecting webs are more rigid than the flexible webs and/or that, given the same geometry and the same material of the connecting webs and the flexible webs, the connecting webs protrude from the support element at a first connection point and the flexible webs protrude from the support element at a second connection point, the second connection point being spaced farther from the flexible webs than the first connection point.

In a further suitable embodiment of the invention it may be provided that the support element itself is supported to be pivotable between a rest position into which the support element is prestressed and at least one pivot position, and that the evaluation and control unit is connected with at least one pivot position sensor for detecting that the support element has adopted a pivot position when the operating strip is actuated. Thus, in this embodiment of the invention the operating strip is slightly pivotable due to the support element being supported in the housing in a slightly pivotable manner. In this regard the support element may be pivotable from a central position into two opposite directions or from a rest position into only one pivot direction. In both cases the support element should be prestressed into the central or the rest position so that the support element automatically returns to this position after the actuation of the operating strip has ended. When the support element takes the at least one pivot position, this may be detected by means of at least one pivot position sensor. The pivot position sensor is connected with the evaluation and control unit in which it is determined on the basis of the signal of the pivot position sensor(s), whether an actuation of the operating strip has occurred. Using the operating field actuation sensors it is thereafter possible to detect the finger position on the operating strip as described above.

In another suitable embodiment it may further be provided that the connecting webs and the flexible webs protrude from a common transversal web, and that the support element has a support body with alternately arranged adjacent edge recesses and projection regions separating the recesses from each other, which form an operating strip edge portion of the support body directed towards the operating strip, wherein the flexible webs extend in the edge recesses and protrude beyond the operating strip edge portion, and wherein the flexible webs are fixed to the support body in the projection regions and also protrude beyond the operating strip edge portion. The substantially comb-shaped structure of the support body of the support element guarantees that, due to the greater free bending length, the flexible webs extending in the edge recesses and protruding beyond the operating strip edge portion are more flexible than the comparatively short flexible webs which are fixed at the projection regions of the support body and therefore protrude beyond the operating strip edge portion of the support body for a comparatively short distance.

It may be advantageous with regard to structure and assembly if the transversal web, the connecting webs and the flexible webs form an integral, comb-like connecting element of the support element with the operating strip, which connecting element in particular contains metal, wherein the support element may comprise plastic material overmolding the connecting element.

In the above described advantageous embodiment of the invention the support body may advantageously be connected with an actuation sensor support plate which covers the edge recesses of the support body and, in these covering regions, has operating field actuation sensors assigned to the flexible webs. The actuation sensor support plate comprising the operating field actuation sensors thus is in contact with the support body e.g. at the upper or the lower side thereof. The operating field actuation sensors are arranged on the covering regions and detect a bending of the flexible webs. It may be useful for the support body to be connected with one actuation sensor plate on either side. In this manner it is possible, e.g. by differential measurement of two operating field actuation sensors respectively assigned to one flexible web, to reliably detect a bending of the respective flexible web, wherein, in addition, the bending direction can also be determined. This is advantageous if the operating strip can be actuated in two opposite directions, e.g. by pressing the operating strip down by putting a finger on the top surface of the operating strip and by pushing the operating strip up by placing a finger of a hand on the bottom surface of the operating strip.

The two different actuation directions of the operating strip are also possible with the use of only one respective operating field actuation sensor if the flexible web is prestressed against the sensor and the stress acting on the sensor increases or decreases depending on the actuation direction.

For the operating field actuation sensors and, if provided, the pivot position sensor(s) it applies that (path or force or pressure) sensor systems can be used that function in a capacitive, inductive, ohmical or optical manner. In addition it is also possible to use limit switches.

For design reasons it may be advantageous for the operating strip to be provided with a coated and thus finished surface at least on its operating field. This may be a painted surface or, in a further exemplary embodiment, a metallic surface. The concept of the present invention allows for this degree of design freedom, since the detection of the finger contact point on the operating strip is performed not in the operating strip itself, but outside the operating strip, namely in the support element. An actuation of the operating strip with a gloved hand is also possible according to the present invention.

The concept of the present invention can be combined with force sense/force feedback systems. In this regard it may be provided that upon the detection of an actuation of the operating strip, the operating strip is caused to perform forced mechanical movements to thereby provide the operator with a haptic/tactile actuation feedback.

Figure 2:
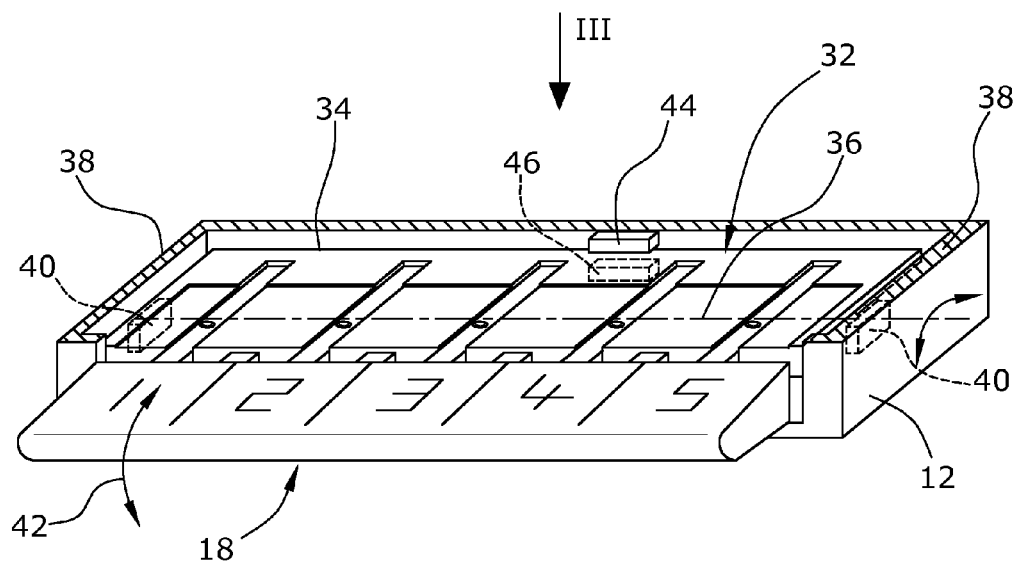
Figure 3:
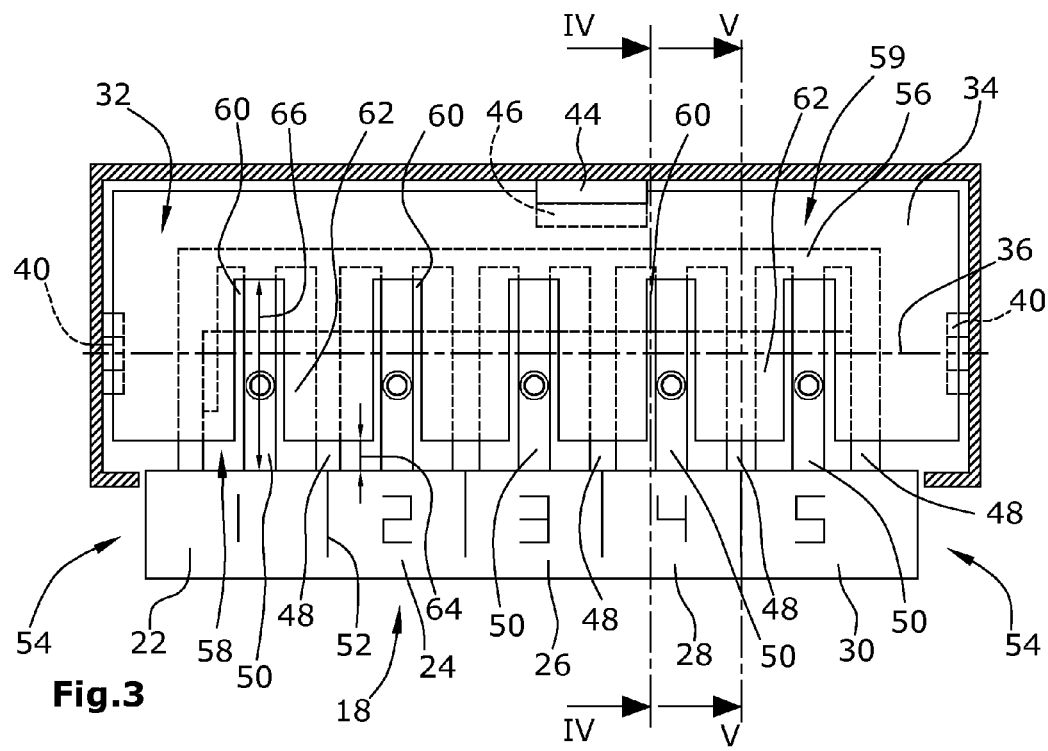
Figure 4:
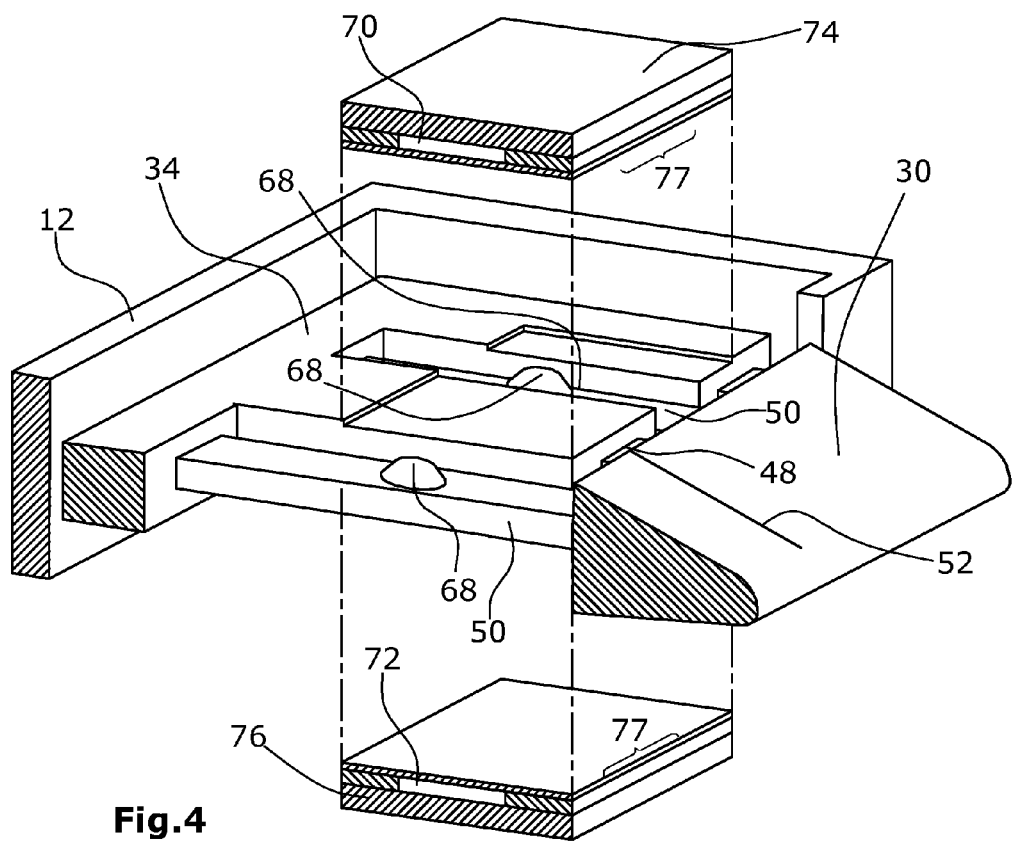
Figure 5:
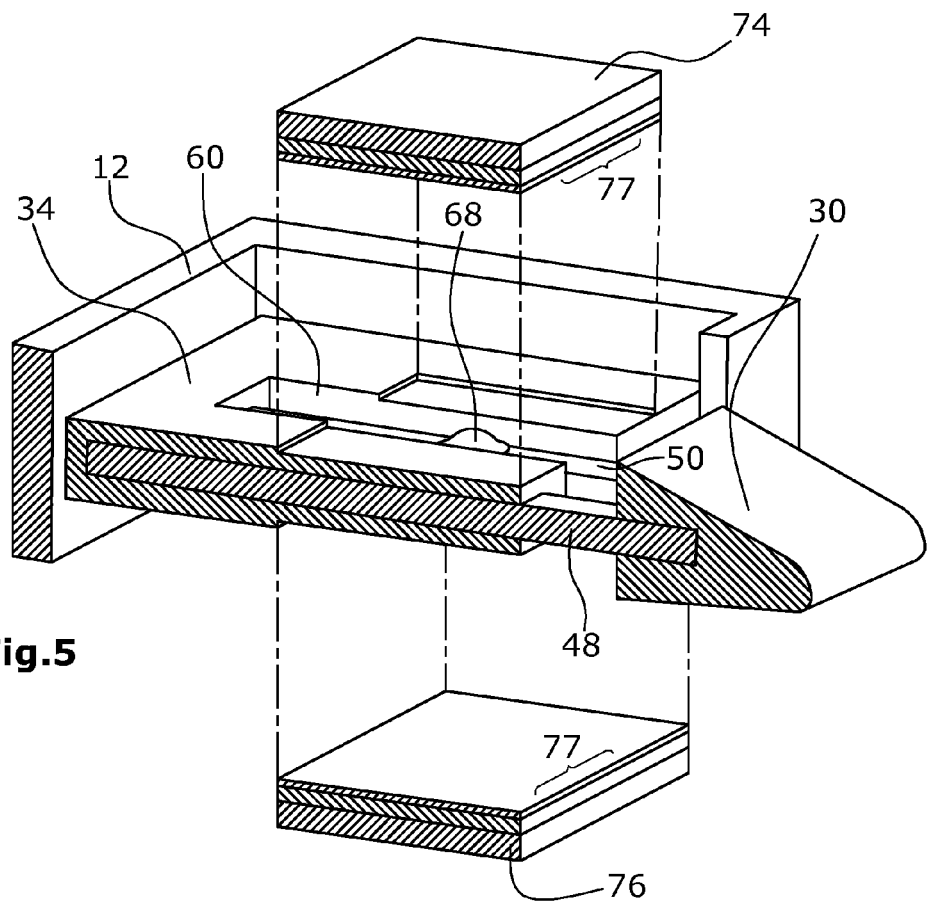
Figure 6:
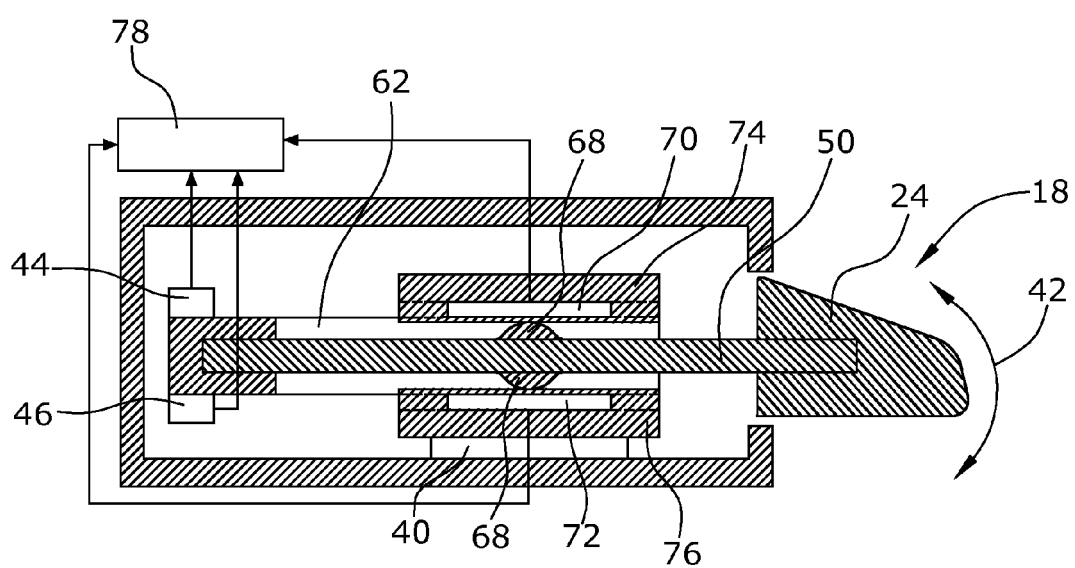
Figure 7:
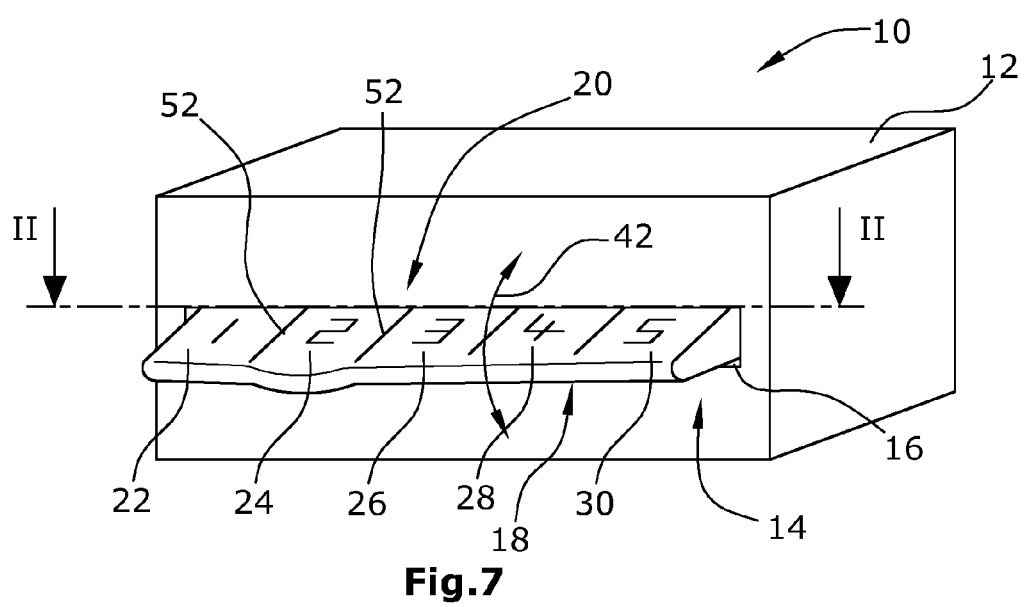

The invention will be explained in more detail hereunder with reference to embodiments and to the drawings. The Figures show:

FIG. 1 a perspective front view of an operating unit for an electrical apparatus, FIG. 2 a perspective view of the "cut-open" operating unit of FIG. 1 to clearly illustrate the pivot bearing and the connection of the operating strip to a support element pivotably supported in the housing, FIG. 3 a top plan view on the cut-open housing according to the arrow III in FIG. 2, FIGS. 4 and 5 perspective sectional views of the carrier element along lines IV and V in FIG. 3 with the housing cut open again to clearly illustrate the structure of the support element and of its connection to the operating strip, FIG. 6 a section through the housing according to VI of FIG. 1 to clearly illustrate the interaction between two operating field actuation sensors per flexible web and the latter, and FIG. 7 a perspective front view as in FIG. 1, but with a clear illustration of the bending in the region of the operating field 2 on which, in this embodiment, a finger of a hand rests when the operating strip is actuated.

FIG. 1 is a perspective front view of a simplified operating unit 10. The operating unit 10 has a housing 12 with a front wall 14 in which a cutout 16 is provided. An operating strip 18 protrudes through the cutout 16, the operating strip protruding beyond the front wall 14. The operating strip 18 has an operating surface 20 with a plurality of operating fields 22, 24, 26, 28 and 30 arranged side by side. The operating unit 10 generally comprises further operating elements and in particular also comprises indicating elements in the form of displays or other typical indicating elements, which, however, are not of importance to the present invention so that they will neither be described in detail herein, nor are they illustrated in the Figures.

As can be seen in particular in FIGS. 2 to 6 the operating strip 18 is connected with a support element 32 arranged inside the housing 12. The support element 32 is substantially plate-shaped and has a support body 34 arranged in the housing 12 in a manner pivotable about a pivot axis 36. For this purpose the housing 12 e.g. comprises two pivot bearing blocks 40 in the area of its two side walls, on which blocks the support body 34 rests in a pivotable manner. Thus, the operating strip 18 can be pivoted in one of the two pivoting directions indicated by the double-headed arrow 42. A pivoting of the support element 32 can be detected in both directions by means of two pivot position sensors 44, 46 which are designed e.g. as limit switches.

What is of importance for the presently described embodiment is the alternating different, flexible connection of the operating strip 18 with the support element 32. This will be described hereinafter with reference to FIGS. 2 to 5.

The mechanical connection of the operating strip 18 with the support element 32 is realized by means of a plurality of adjacent webs e.g. of metal or of another elastically flexible material. Here, connecting webs 48 and flexible webs 50 alternate. These webs are connected with the operating strip 18 in different areas of the latter. For instance, the connecting webs 48 are situated at the borders 52 between respective adjacent operating fields, as well as at the two outermost ends 54 of the operating strip 18, whereas the flexible webs 50 are connected with the operating strip 18 approximately in the middle of each operating field. The connecting webs 48, as well as the flexible webs 50 are of a leaf-spring design and protrude from a transversal web 56 integrally connected with these webs. In this manner a comb-like connecting element 59 is formed that is a part of the support element 32.

The comb-like connecting element 59 is fixed to the support body 34 which in this embodiment comprises plastic material molded over the comb-like structure of the webs.

As an alternative the comb-like connecting element 59 of another embodiment can be mounted on the support body 34 (e.g. by screwing, hot pressing, riveting etc.). Here, the support body 34 itself also has a comb-like structure, since the support body is provided with edge recesses 60 at the operating strip edge portion 58, i.e. the edge portion of the support element 32 that faces the operating strip 18, with projection portions 62 being arranged between the recesses. The transverse web 56 from which the flexible webs 50 and the connecting webs 48 protrude, is fixed at the support body 34, namely by being embedded in the plastic material of the support body 34. The connecting webs 48 are also embedded in the material of the support body 34 and are thus fixed at the support body 34 by extending alongside the projection portions 62 and thereby protrude beyond the operating strip edge portion 58 only by a short free length 64.

In contrast thereto, the flexible webs 50 extend through the edge recesses 60, i.e. they have a substantially longer free bending length 66 than the connecting webs 48.

This is again clearly illustrated in FIG. 4 in which it can also be seen that pushers 68 are molded onto the top and bottom surfaces of the flexible webs 50, which, as illustrated in FIG. 6, cooperate with operating field actuation sensors 70, 72. Further embodiments may be in the form of embossed pushers (in the flexible web) or separately mounted pushers. These operating field actuation sensors 70, 72 are situated on support plates 74, 76 resting on the support body 34 above and below the latter. The operating field actuation sensors 70, 72 are positioned within bridging portions 77 of the support plates 74, 76, within which these bridging portions 77 cover the edge recesses 60 of the support body 34. The operating field actuation sensors 70, 72 and the pivot position sensors 44, 46 are connected with an evaluation and control unit 78 in which a downward directed pressing or an upward directed pulling of the operating strip 18 is detected, namely on the basis of the signals of the pivot position sensors 44, 46, and in which it is further detected which operating field of the operating strip 18 a finger of a hand rests on or engages when the operating strip is actuated.

The latter is detected based on the local bending of the operating strip 18 as is clearly illustrated in FIG. 7. When, upon actuation of the operating strip 18, a finger of a hand rests on e.g. the operating field 24, the strip, in this example, bends downward in the area of the operating field 24. At the borders 52 of the operating field 24 with its neighboring operating fields 22, 26 the operating strip 18 is comparatively rigidly connected with the support body 34. The bending in the area of the operating field 24 is thus transmitted to the neighboring operating field 22, 26 in a significantly dampened manner. The bending in the area of the operating field 24 is detected based on a deflection of the flexible web 50 assigned to this operating field 24, namely by means of the operating field actuation sensors 70, 72 of the respective flexible web 50. The operating field actuation sensors 70, 72 assigned to the operating field 24 output a larger signal than the operating field actuation sensors 70, 72 assigned to the neighboring operating fields 22, 26 or the flexible webs 50 of these neighboring operating fields.

By means of the presently described concept operating strip that is coupled in a locally flexible, as well as a locally rigid and, as such, in an alternately flexible and rigid manner, it is possible to determine the point of force application upon a manual actuation of the operating strip 18 with great security and reliability. This requires no touch sensor system or capacitive sensor system of the operating strip 18 so that the latter enjoys large degrees of freedom with respect to surface design and surface material, which in particular are not compromised by sensor systems for touch recognition. Thus, for example, the operating surface 20 or the entire surface of the operating strip 18 can be coated and thus be provided with a finish, wherein the assembly of the support material of the operating strip 18 and the surface layer is sufficiently elastically flexible to enable the detection of local elastic bending of the operating strip 18, although in a manner imperceptible to the operator, so as to give the impression of a rigid operating strip.

LIST OF REFERENCE NUMERALS

10 operating unit
12 housing of the operating unit
14 front wall of the housing
16 cutout in the front wall
18 operating strip
20 operating surface of the operating strip
22 operating field on the operating surface
24 operating field on the operating surface
26 operating field on the operating surface
28 operating field on the operating surface
30 operating field on the operating surface
32 support element for the operating strip
34 support body of the support element
36 pivot axis of the support element
38 side walls of the housing
40 pivot bearing blocks
42 double-headed arrow (pivoting directions of the operating strip)
44 pivot position sensor
46 pivot position sensor
48 connecting webs
50 flexible webs
52 borders between the operating fields
54 ends of the operating strip
56 transversal web
58 operating strip edge portion
59 comb-like connecting element between support body and operating strip
60 edge cutouts
62 projection portions
64 free length of each connecting web
66 bending length of each flexible web
68 pusher
70 operating field actuation sensor
72 operating field actuation sensor
74 sensor support plate
76 sensor support plate
77 bridging portions of each sensor support plate
78 evaluation and control unit

The invention claimed is:

1. An operating unit for an electrical apparatus, the operating unit being provided with
 a housing having a front wall,
 an operating strip projecting beyond the front wall, the operating strip having an elongated operating surface with a plurality of operating fields arranged side by side,
 a support element for the operating strip, which is arranged in the housing,
 wherein the operating strip is connected to the support element by means of connecting webs which protrude in the respective areas between the operating fields of the operating strip,
 wherein flexible webs, which protrude from the operating strip for each operating field and are connected to the support element, are arranged between the connecting webs, namely in an elastic manner and more flexible than the connections of the operating strip to the support element via the connecting webs,
 wherein at least one operating field actuation sensor is arranged on the support element for each flexible web for the detection of a local bending of the operating strip, when a manual actuating force is exerted on an operating field of the operating strip, and
 an evaluation and operating unit for receiving the signals of the operating field actuation sensors and for determining, on the basis of said signals, the operating field on which, upon manual actuation of the operating strip, a finger of one hand is applied, and for triggering an apparatus function that is associated with the respective operating field corresponding to the determined operating field.

2. The operating unit of claim 1, wherein for reasons of their geometry, their material and/or the position of their connection with the support element and/or the operating strip, the connecting webs are more rigid than the flexible webs and/or that the connecting webs are shorter than the flexible webs and/or have a shorter free bending length than the flexible webs, in particular due to the fact that the connecting webs protrude from the support element at a first connection point and the flexible webs protrude from the support element at a second connection point, the second connection points being spaced farther from the operating strip than the first connection point.

3. The operating unit of claim 2, wherein, if the connecting webs are shorter than the flexible webs, both have the same geometry and comprise the same material.

4. The operating unit of claim 1, wherein the support element itself is supported to be pivotable between a rest position into which the support element is prestressed and at least one pivot position, and that the evaluation and control unit is connected with at least one pivot position sensor for detecting that the support element has adopted a pivot position when the operating strip is actuated.

5. The operating unit of claim 1, wherein the connecting webs and the flexible webs protrude from a common transversal web, and that the support element has a support body with alternately arranged adjacent edge recesses and projection regions separating the recesses from each other, which regions form an operating strip edge portion of the support body directed towards the operating strip, wherein the flexible webs extend in the edge recesses and protrude beyond the operating strip edge portion, and wherein the flexible webs are fixed to the support body in the projection regions and also protrude beyond the operating strip edge portion.

6. The operating unit of claim 5, wherein the transversal web, the connecting webs and the flexible webs form an integral, comb-like connecting element of the support element with the operating strip, and that the support element may comprise plastic material overmolding the connecting element or that the connecting element is fixed to the support element in another manner.

7. The operating unit of claim 6, wherein the connecting element comprises metal.

8. The operating unit of claim 5, wherein at least one actuation sensor support plate is connected with the support body, the actuation sensor support plate covering the edge recesses of the support body and comprising operating field actuation sensors in these covering regions, which sensors are assigned to the flexible webs, and which sensors allow the detection of a bending of the flexible webs in only one direction or in two opposite directions.

9. The operating unit of claim 8, wherein the support body is arranged between two actuation sensor support plates, each flexible web having two operating field actuation sensors assigned thereto, one of which is adapted to be arranged on the one support plate and the other can be arranged on the other support plate.

10. The operating unit of claim 1, wherein the operating field actuation sensors and, if provided, the pivot position sensor function in a capacitive, inductive, ohmical or optical manner or are de-signed as limit switches.

11. The operating unit of claim 1, wherein the operating strip is provided with a coated and thus finished surface at least on its operating field.

12. The operating unit of claim 1, wherein the operating field actuation sensors allow the detection of an actuation of the operating strip both when a finger of a hand is in contact with the upper side or the lower side of the operating strip.

13. The operating unit of claim 1, wherein the electrical apparatus is a vehicle component.

14. The operating unit of claim 13, wherein the vehicle component is a heating, ventilation and/or air condition system.

* * * * *